(12) United States Patent
Lehmann et al.

(10) Patent No.: US 6,887,437 B1
(45) Date of Patent: May 3, 2005

(54) REACTOR CONFIGURATION AND METHOD FOR PRODUCING IT

(75) Inventors: Volker Lehmann, München (DE); Stefan Ottow, Dresden (DE); Reinhard Stengl, Stadtbergen (DE); Hans Reisinger, Grünwald (DE); Hermann Wendt, Grasbrunn (DE)

(73) Assignee: Infineon Technologies AG, Munich (DE)

( * ) Notice: Subject to any disclaimer, the term of this patent is extended or adjusted under 35 U.S.C. 154(b) by 876 days.

(21) Appl. No.: 09/718,902

(22) Filed: Nov. 22, 2000

Related U.S. Application Data

(63) Continuation of application No. PCT/DE99/01357, filed on May 5, 1999.

(30) Foreign Application Priority Data

May 22, 1998  (DE) .......................... 198 23 036

(51) Int. Cl.$^7$ .......................... B01D 50/00; B01D 53/34
(52) U.S. Cl. ...................... 422/177; 422/179
(58) Field of Search ................. 422/177, 179, 422/180, 168

(56) References Cited

U.S. PATENT DOCUMENTS

| | | | |
|---|---|---|---|
| 5,426,082 A | * | 6/1995 | Marsden ..................... 502/235 |
| 5,534,328 A | | 7/1996 | Ashmead et al. |
| 5,811,062 A | * | 9/1998 | Wegeng et al. ............. 422/129 |
| 6,036,927 A | * | 3/2000 | Chatterjee et al. .......... 422/211 |
| 6,200,536 B1 | * | 3/2001 | Tonkovich et al. ......... 422/177 |

FOREIGN PATENT DOCUMENTS

| | | | |
|---|---|---|---|
| DE | 39 15 920 A1 | 11/1990 | |
| EP | 0 281 364 A2 | 9/1988 | |
| WO | WO 96/30934 | 10/1996 | |
| WO | WO96/30934 | * 10/1996 | .......... H01L/21/00 |

OTHER PUBLICATIONS

Georg Wiessmeier et al.: "Microfabricated components for heterogeneously catalysed reactions", *Micromech. Microeng. vol. 6, 1996, pp.285–289.*

Nicholas P. Chopey et al: "Microreactors Finding New Niches", *Chemical Engineering, Mar. 1997, pp. 30–33.*

\* cited by examiner

*Primary Examiner*—M. Alexandra Elve
(74) *Attorney, Agent, or Firm*—Laurence A. Greenberg; Werner H. Stemer; Ralph E. Locher

(57) ABSTRACT

A reactor configuration contains a housing connected to a silicon wafer. The silicon wafer has pores extending from a first main area of the silicon wafer into an interior of the silicon wafer, preferably as far as a second main area of the silicon wafer. A catalyst layer at least partly covers the surface of the pores.

8 Claims, 3 Drawing Sheets

REACTOR CONFIGURATION AND METHOD FOR PRODUCING IT

CROSS-REFERENCE TO RELATED APPLICATION

This is a continuation of copending International Application PCT/DE99/01357, filed May 5, 1999, which designated the United States.

BACKGROUND OF THE INVENTION

Field of the Invention

The invention relates to a reactor configuration for carrying out catalytic, chemical reactions and also to a method for producing it.

Many chemical reactions that are used on a large scale in the chemical industry are catalytic in nature. Reactor configurations produced by micromachining are increasingly being used to carry out such processes. The term microreactor has become established for such reactor configuration. They contain a porous body with a catalyst present on its surface.

A reference by G. Wiessmeier et al., titled Micromech. Eng. 1996, pages 285 to 289, proposes a microreactor which is constructed by micromachining. To that end, a stack of microstructured aluminum sheets is formed on an aluminum plate and is converted into $Al_2O_3$ by anodic oxidation. The surface of the structured sheets is provided with a catalyst. The aluminum plate is not porous. In this configuration, the catalyst temperature is upwardly limited by the melting point of aluminum at 500° C. The reactants pass into the pores by diffusion.

SUMMARY OF THE INVENTION

It is accordingly an object of the invention to provide a reactor configuration and a method for producing it which overcome the above-mentioned disadvantages of the prior art devices and methods of this general type, in which higher catalyst temperatures are permissible.

With the foregoing and other objects in view there is provided, in accordance with the invention, a reactor configuration containing a housing and a silicon wafer disposed in the housing and monolithically connected to parts of the housing. The silicon wafer has a first main area, a second main area, and a reaction space formed therein with pores formed therein running from the reaction space to the first main area and from the reaction space to the second main area. A catalyst layer is provided and at least partly covers a surface defining the pores. In addition, the housing has a first feed formed therein, a second feed formed therein adjacent the second main area, and a third feed formed therein adjacent the first main area and via which reactants can be fed in independently of the first feed.

The reactor configuration contains a housing connected to a silicon wafer. The silicon wafer is monolithically connected to housing parts, with the result that parts of the silicon wafer form part of the housing.

The silicon wafer has pores extending from a main area of the silicon wafer into the interior of the silicon wafer. A catalyst layer is provided, which at least partly covers the surface of the pores. The silicon wafer acts as a catalyst support in the reactor configuration. On account of the melting point of silicon being 1415° C., considerably higher catalyst temperatures are therefore permissible in the reactor configuration. At least one feed is provided above the first main area in the housing, via which feed reactants can be fed to or from the pores.

The pores preferably have a diameter in the range of between 1 $\mu$m and 10 $\mu$m. The depth of the pores is from 50 $\mu$m to 500 $\mu$m.

The pores can be produced both by anisotropic dry etching and by electrochemical etching.

In order to further enlarge the surface of the pores, it is advantageous to provide the side walls of the pores with lateral pores whose diameter is at least a factor of 10 less than the diameter of the pores. Such a porous silicon wafer can advantageously be produced by electrochemical etching.

Preferably, the pores run in the silicon wafer from the first main area to an opposite, second main area of the silicon wafer. In this case, reactants can be conducted through the silicon wafer by pressure or pumping. Defined reaction times can thereby be established.

For a controlled reaction between two different reactants, it is advantageous to provide a reaction space in the silicon wafer, the pores running from the reaction space to the first main area and to the second main area. Such a reaction space connected with pores can be produced by an electrochemical etching by varying the etching parameters.

If the silicon wafer has pores running from the first main area to the second main area, then it is advantageous to provide a second feed adjacent to the second main area in the housing, via which second feed reactants can be fed in or taken away. As an alternative, the second main area may be flanged onto a vessel from which or into which the reactants are filled in or drawn off.

In order to carry out reactions of different reactants in a controlled manner it is advantageous to provide in the housing a third feed adjacent to the first main area in addition to the first feed.

In order to carry out reactions with an aggressive catalyst layer and/or aggressive reaction products and/or reactants, it is advantageous to provide an inert layer, in particular made of silicon nitride, silicon oxide, boron nitride or metal silicide, on the surface of the pores between the surface of the pores and the catalyst layer.

One of the substances platinum, palladium, gold, rhodium is suitable, inter alia, as the catalyst layer.

The reactor configuration is suitable, inter alia, for analyzing DNA. Further advantageous applications of the reactor arrangement include all catalytic reactions.

The pores are preferably produced by electrochemical etching in a fluoride-containing acidic electrolyte with respect to which the silicon wafer is connected up as an anode. Since the silicon wafer is connected as the anode, during the electrochemical etching, minority charge carriers move in the silicon to the first main area, which is in contact with the electrolyte. A space charged zone forms at the first main area. Since the field strength is greater in the region of depressions in the surface than outside the region, the minority charge carriers preferably move to these points. This results in the surface being patterned. The deeper an initially small unevenness becomes as a result of the etching process, which unevenness can be introduced into the first main area in a targeted manner by a previous etching process, the more minority charge carriers move there too owing to the increased field strength and the greater the etching attack is at this location.

The etching attack is dependent on the current density in the silicon wafer and on the fluoride concentration in the electrolyte. The pore diameter is increased by increasing the current density in the electrolyte or by reducing the fluoride concentration in the electrolyte. In this way, a reaction space, whose diameter is greater than that of the pores can be formed in the interior of the substrate wafer. In particular, a connection is thereby produced between the individual pores. Furthermore, by reducing the current density and increasing the potential at the end of an electrochemical etching process, lateral pores having a smaller diameter than that of the pores can be formed in the side walls of the pores. Since the diameter of pores depends on the doping, fine lateral pores can also be produced by increasing the n-doping (for example by outdiffusion from PSG) and a second electrochemical etching operation.

With the foregoing and other objects in view there is further provided, in accordance with the invention, a method for producing a reactor configuration. The method includes the steps of providing a silicon wafer; and electrochemical etching pores in the silicon wafer using an acidic, fluoride-containing electrolyte with respect to which the silicon wafer is connected up as an anode.

In accordance with an added feature of the invention, there are the steps of:
  setting a constant current density in a course of the electrochemical etching until the pores have reached a first depth measured from a first main area of the silicon wafer;
  increasing the current density after the first depth has been reached, with a result that a diameter of the pores increases and adjacent pores grow together to form a reaction space; and
  reducing the current density after a second depth has been reached, with a result that separate pores grow from the second depth as far as a second main area of the silicon wafer.

In accordance with a concomitant feature the invention, after the pores have been formed, there is the step of changing parameters of the electrochemical etching such that lateral pores having a diameter which is at least a factor of 10 less than that of the pores are formed in side walls defining the pores.

Other features which are considered as characteristic for the invention are set forth in the appended claims.

Although the invention is illustrated and described herein as embodied in a reactor configuration and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
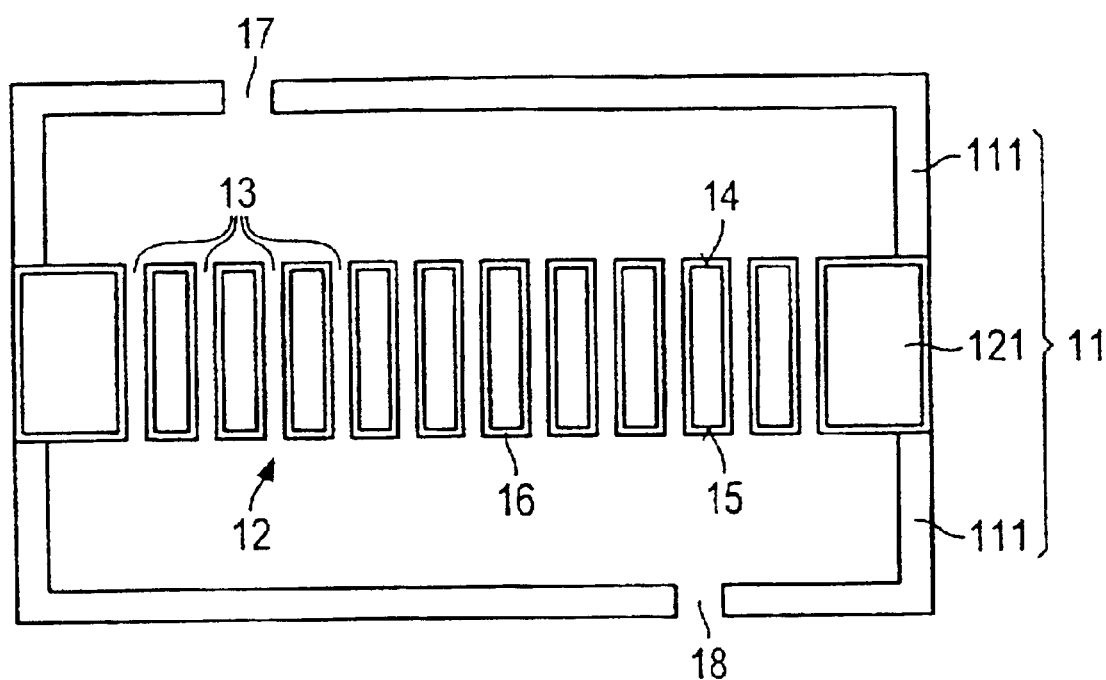
FIG. 1 is a diagrammatic, sectional view through a reactor configuration having a silicon wafer with continuous pores according to the invention.

In all the figures of the drawing, sub-features and integral arts that correspond to one another bear the same reference symbol in each case. Referring now to the figures of the drawing in detail and first, particularly, to FIG. 1 thereof, there is shown a reactor configuration formed of a housing 11, in which a silicon wafer 12 is disposed. In its central region, the silicon wafer 12 has pores 13 running from a first main area 14 to a second main area 15. Outside the central region, the silicon wafer 12 has a solid edge region 121. A surface of the silicon wafer 12 is provided with a catalyst layer 16 made of Au, Pd, Pt, Rh with a layer thickness of 10 nm.

The housing 11 contains two housing parts 111 made, for example, of glass, Si, $SiO_2$, $Al_2O_3$ or the like, which adjoin the edge region 121 and terminate tightly with the edge region 121. The two housing parts 111 and the edge region 121 together form the housing 11.

The pores 13 have a diameter of from 1 to 10 $\mu$m.

The thickness of the silicon wafer 12 parallel to the course of the pores 13 is 500 $\mu$m.

On its side adjacent to the first main area 14, the housing 11 has a first feed 17 in one of the housing parts 111 and, on its side adjacent to the second main area 15, the housing has a second feed 18 in the other housing part 111.

The silicon wafer 12 is disposed in the housing 11 in such a way that it terminates tightly with the wall of the housing parts 111. Reactants which pass via the first feed 17 into the space adjacent to the first main area 14 can only pass via the pores 13 to the second feed 1B. During operation, the reactants are pumped through the first feed 17 with a pressure of from 0 to 10 bar.

In order to produce the silicon wafer 12, the silicon wafer made of n-doped monocrystalline silicon is brought into contact by its first main area with a fluoride-containing, acidic electrolyte with a hydrochloric acid concentration of 3 percent by weight. The silicon wafer 12 is connected up as an anode. To that end, a voltage of 3 volts is applied between the silicon wafer 12 and the electrolyte. The silicon wafer 12 is illuminated with light from the second main area 15, with the result that a current density of 10 mA/cm$^2$ is established. Proceeding from depressions formed in the first main area 14, by a masked, alkaline etching process, the pores 13 are produced in the course of the electrochemical etching.

After an etching time of about 10 hours, the etching reaches the second main area 15, with the result that the pores run continuously from the first main area 14 to the second main area 15.

The catalyst layer 16 made of Au, Pd, Pt or Rh is applied by chemical vapor deposition (CVD).

Figure 2:
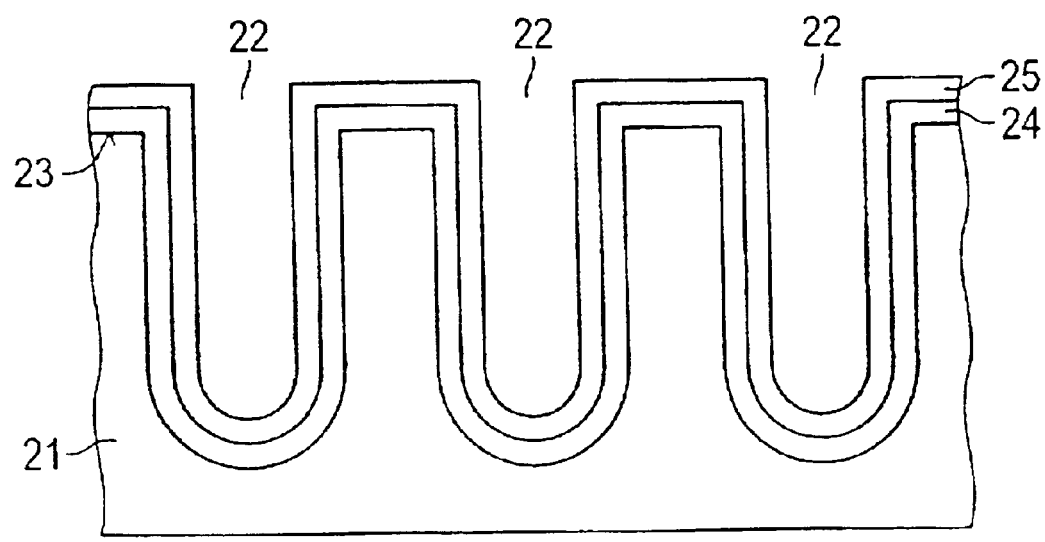
FIG. 2 is a sectional view through a second embodiment of the silicon wafer having the pores that extend from a first main area into the silicon wafer.

In a second exemplary embodiment, a silicon wafer 21 has pores 22 which, proceeding from a first main area 23, extend down into the depth of the silicon wafer 21 (see FIG. 2). The pores 22 have a diameter of 10 $\mu$m and a depth of 500 $\mu$m.

The pores 22 are produced by electrochemical etching in an analogous manner to that explained with reference to FIG. 1. Except for the etching time, the same etching parameters as in the example outlined with reference to FIG. 1 are used. The etching time is ended after 8 hours, however, with the result that the pores 22 end in the silicon wafer 21.

An inert layer 24 made of silicon nitride with a thickness of 100 nm is applied to the surface of the pores 22. The inert layer 24 is deposited using a CVD method. A catalyst layer 25 made of platinum or palladium with a thickness of 10 nm is applied to the inert layer 24 by CVD deposition or vapor deposition.

Figure 3:
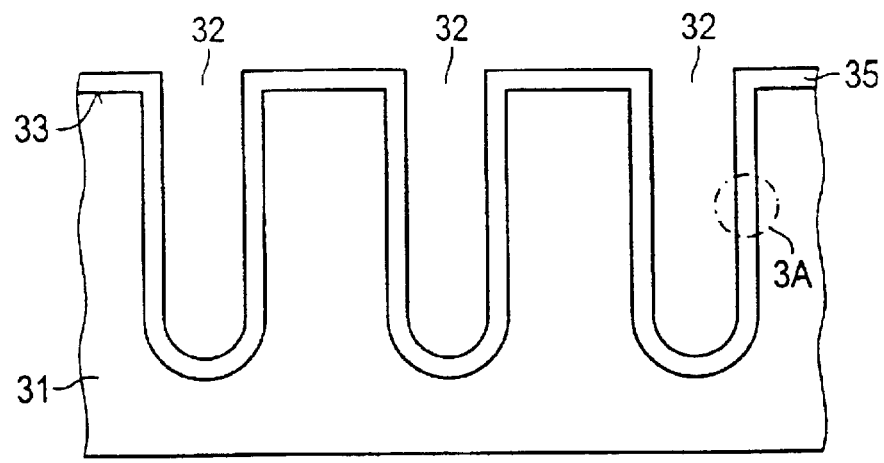
FIG. 3 is a sectional view through a third embodiment of the silicon wafer having the pores that have lateral pores in a region of the side walls.
Figure 3A:
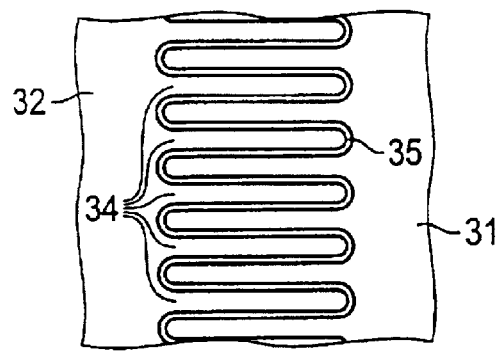
FIG. 3a is an enlarged, partial sectional view showing a side wall of the pores of the silicon wafer illustrated in FIG. 3.

In a third exemplary embodiment, a silicon wafer 31 has pores 32 extending from a first main area 33 into the silicon wafer 31 (see FIG. 3). Side walls of the pores 32 have lateral pores 34 whose diameter is considerably less than the diameter of the pores 32 (see FIG. 3a, in which the detail designated by 3A in FIG. 3 is shown enlarged).

In order to produce the silicon wafer 31, the first main area 33 is brought into contact with a hydrofluoric acid-containing, an acidic electrolyte with a hydrofluoric acid concentration of 6 percent by weight. The silicon wafer 31 is connected up as the anode and has a potential of 2 volts applied to it. The silicon wafer 31 is illuminated from the rear side, with the result that a current density of 15 mA/cm$^2$ is established. Proceeding from depressions in the first main area 33, the depressions being formed beforehand by alkaline etching using a mask produced by photolithography, the etching advances into the silicon wafer 31, with the pores 32 being formed. After an etching time of 8 hours, the diameter of the pores 32 is 10 $\mu$m and the depth is 400 $\mu$m.

Afterwards, the potential to which the silicon wafer 31 is connected is increased to 10 volts and the illumination is switched off. The remaining parameters remain unchanged. The electrochemical etching is resumed at this increased voltage.

The lateral pores 34 formed in the side walls of the pores 32 have a diameter of 100 nm. The etching is continued for 3 minutes, with the result that the depth of the lateral pores 34 measured from the side wall of the pores 32 is 5 $\mu$m.

Afterwards, a catalyst layer 35 made of Au, Pt, Pd, or Rh is applied by a CVD process. The catalyst layer 35 has a thickness of 10 nm. It covers the surface of the pores 32 and of the lateral pores 34 with essentially conformal edge coverage.

Figure 4:
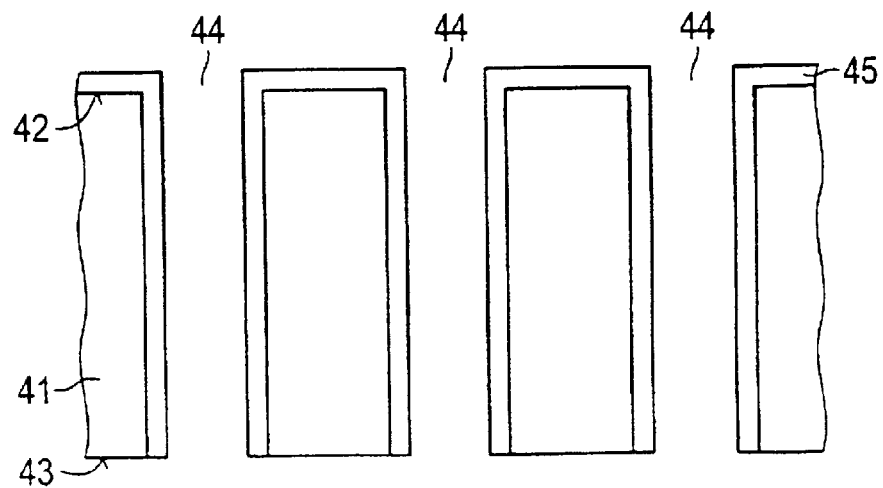
FIG. 4 is a sectional view through a fourth embodiment of the silicon wafer having the continuous pores.

In a fourth exemplary embodiment, a silicon wafer 41 has pores 44 running from a first main area 42 to a second main area 43. Side-walls of the pores 44 and the first main area 42 are covered with a catalyst layer 45. The catalyst layer 45 has a thickness of 10 nm and contains Au, Pt, Pd or Rh. By contrast, the second main area 43 of the silicon wafer 41 is uncovered (see FIG. 4).

The silicon wafer 41 is produced in an analogous manner to that explained in connection with FIG. 2. First, the pores 44 are produced, which extend from the first main area 42 into the depth of the silicon wafer 41. Afterwards, the catalyst layer 45 made of Au, Pt, Pd or Rh is formed by a CVD process or a vapor deposition process. Afterwards, the silicon wafer 41 is thinned back by grinding or etching from the second main area 43, thereby producing the sieve-like structure illustrated in FIG. 4.

Figure 5:
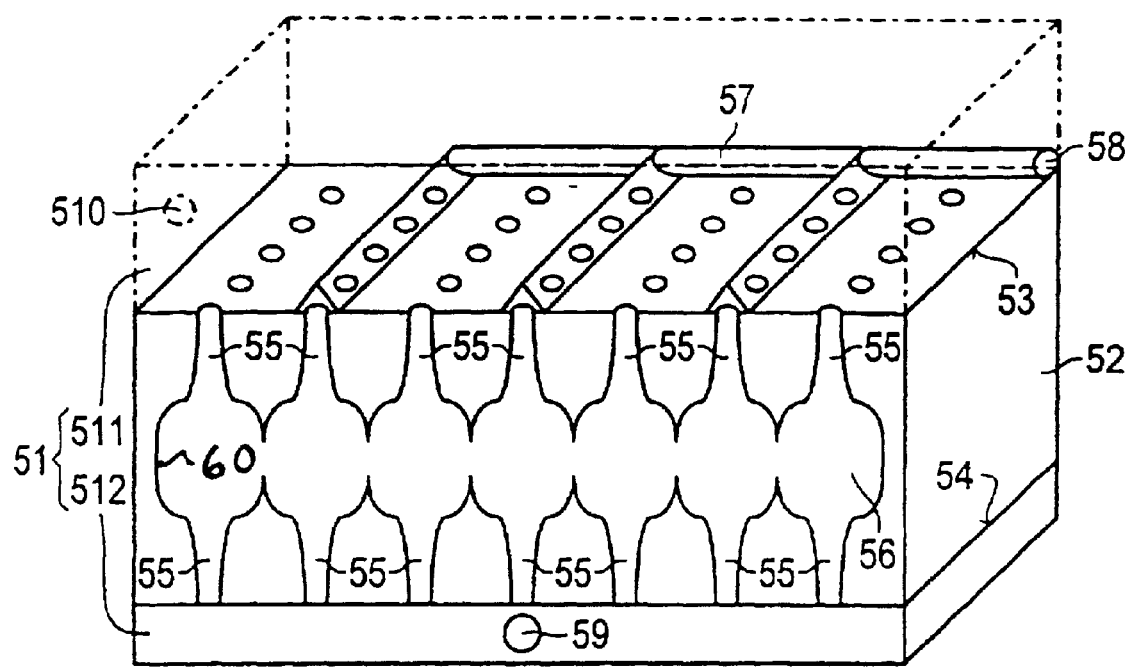
FIG. 5 is a perspective view of a section of the reactor configuration of a fifth embodiment of the silicon wafer which contains a reaction space connected via the pores to a first main area and a second main area.

A housing 51 contains a first housing part 511 and a second housing part 512, which are each tightly connected to a silicon wafer 52 according to a fifth embodiment shown in FIG. 5. In this case, the first housing part 511 adjoins a first main area 53 of the silicon wafer 52 and the second housing part 512 adjoins a second main area 54 of the silicon wafer 52. The first housing part 511 and the second housing part 512 are composed of Si, for example.

The silicon wafer 52 has pores 55 extending from the first main area 53 and from the second main area 54 as far as a reaction space 56 in an interior of the silicon wafer 52.

The pores 55 are disposed in parallel rows along the first main area 52. Every second row of the pores 55 is connected to a first feed 58 via a pipeline 57. The rows of pores 55 disposed in-between end in a cavity spanned by the housing part 511 above the first main area 53. In the region of the second main area 54, the pores 55 all open into a cavity spanned by the second housing part 512 adjacent to the second main area 54.

The second housing part 512 is provided with a second feed 59 and the first housing part 511 is provided with a third feed 510.

As an alternative, the first housing part 511 and the second housing part 512 are formed from silicon. In this case, grooves are provided in each of the housing parts 511, 512, which grooves are on the one hand connected to the first feed 58, the second feed 59 and the third feed 510, respectively, and on the other hand adjoining the pores 55 which are connected to the relevant feed 58, 59, 510. The grooves in the first housing part 511, preferably have a comb-like configuration, the grooves connected to the first feed 58 engaging in the grooves connected to the second feed 59.

During the operation of the reactor configuration, a first type of reactant is fed in via the first feed 58 and a second type of reactant is fed in via the third feed 510. The reactants pass via the pores 55 into the reaction space 56, in which they react. Reaction products pass through the pores 55 from the reaction space 56 to the second main area 54 and from there to the second feed 59.

The surface of the pores 55 and of the reaction space 56 is provided with a catalyst layer 60 trade of Au, Pt, Pd or Rh with a layer thickness of 10 nm.

In order to produce the silicon wafer 52, the first main area 53 is provided with depressions disposed in rows and produced by an alkaline etching with the aid of a mask produced by photolithography. The first main area 53 is then brought into contact with a hydrofluoric acid-containing, acidic electrolyte with a hydrofluoric acid concentration of 3 percent by weight. The silicon wafer 52 is connected up as the anode and has a potential of 3 volts applied to it. The silicon wafer 52 is illuminated from the second main area 54, with the result that a current density 10 mA/cm$^2$ is established. Proceeding from the depressions disposed in rows, the pores 55 are in this case produced down to a first depth of 200 $\mu$m. The first depth is reached after an etching time of 4 hours. The current density is then increased to 30 mA/cm$^2$ by reduction of the potential at the silicon wafer 52 to 2 volts and illumination from the second main area 54. The electrochemical etching is resumed, the changed parameters meaning that the cross section of pores grows until adjacent pores 55 grow together and form the cavity-like reaction space 56. After a second depth of 300 $\mu$m has been reached, corresponding to a dimension parallel to the course of the pores 55 of 100 $\mu$m for the reaction space 56, the etching parameters are changed to 10 MA/cm$^2$ for a further 4 hours. The electrochemical etching is resumed with these parameters, the pores 55 being formed between the reaction space 56 and the second main area 54. The electrochemical etching is ended after the second main area 54 has been reached.

We claim:
1. A reactor configuration, comprising:
   a housing;
   a silicon wafer disposed in said housing and monolithically connected to parts of said housing, said silicon-wafer having a first main area, a second main area, and a reaction space formed therein with pores formed therein running from said reaction space to said first main area and from said reaction space to said second main area; and a catalyst layer at least partly covering a surface defining said pores;

said housing having a first feed formed therein, a second feed formed therein adjacent said second main area, and a third feed formed therein adjacent said first main area and via which reactants can be fed in independently of said first feed.

2. The reactor configuration according to claim 1, wherein said pores have a diameter in the range of 1 µm to 10 µm.

3. The reactor configuration according to claim 1, wherein said silicon wafer has side walls defining said pores and said side walls have lateral pores with a given diameter formed therein, said given diameter of said lateral pores being at least a factor of 10 less than that of said pores.

4. The reactor configuration according to claim 1, including an inert layer disposed between a surface of said pores and said catalyst layer.

5. The reactor configuration according to claim 4, wherein said inert layer is formed of at least one material selected from the group consisting of silicon nitride, silicon oxide, boron nitride, and metal silicide.

6. The reactor configuration according to claim 1, wherein said catalyst layer is formed of a material selected from the group consisting of platinum, palladium, gold and rhodium.

7. A method for producing a reactor configuration, which comprises the steps of:

providing a silicon wafer;

electrochemically etching pores in the silicon wafer using an acidic, fluoride-containing electrolyte with respect to which the silicon wafer is connected up as an anode, the etching step including:

setting a constant current density in a course of the electrochemical etching until the pores have reached a first depth measured from a first main area of the silicon wafer;

increasing the current density after the first depth has been reached, with a result that a diameter of the pores increases and adjacent pores grow together to form a reaction space; and reducing the current density after a second depth has been reached, with a result that separate pores grow from the second death as far as a second main area of the silicon wafer;

at least partially covering a surface defining the pores with a catalyst layer;

placing the silicon wafer in a housing and monolithically connecting the silicon wafer to parts of the housing, the housing having a first feed formed therein, a second feed formed therein adjacent the second main area of the silicon wafer, and a third feed formed therein adjacent the first main area of the silicon wafer, reactants being fed in via the third feed independently of the first feed.

8. The method according to claim 7, which comprises after the pores have been formed, changing parameters of the electrochemical etching such that lateral pores having a diameter which is at least a factor of 10 less than that of the pores are formed in side walls defining the pores.

* * * * *